(12) United States Patent
Nakamura et al.

(10) Patent No.: US 8,366,830 B2
(45) Date of Patent: Feb. 5, 2013

(54) SUSCEPTOR APPARATUS FOR INVERTED TYPE MOCVD REACTOR

(75) Inventors: Shuji Nakamura, Santa Barbara, CA (US); Steven DenBaars, Goleta, CA (US); Max Batres, Santa Barbara, CA (US); Michael Coulter, Santa Barbara, CA (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 10/382,198

(22) Filed: Mar. 4, 2003

(65) Prior Publication Data

US 2004/0175939 A1    Sep. 9, 2004

(51) Int. Cl.
*H01L 21/00*    (2006.01)
*C23C 14/00*    (2006.01)
*C23C 16/00*    (2006.01)

(52) U.S. Cl. .................. 118/725; 118/728; 118/724

(58) Field of Classification Search .......... 118/715–733; 117/921; 204/192.1, 298.01
See application file for complete search history.

(56) References Cited

U.S. PATENT DOCUMENTS

| | | | | |
|---|---|---|---|---|
| 4,732,110 A | * | 3/1988 | Parsons ...................... | 118/719 |
| 5,284,519 A | * | 2/1994 | Gadgil ........................ | 118/719 |
| 5,354,412 A | * | 10/1994 | Suzuki et al. .................. | 117/99 |
| 5,356,476 A | | 10/1994 | Foster et al. .................. | 118/725 |
| 5,370,739 A | | 12/1994 | Foster et al. .................. | 118/725 |
| 5,458,689 A | * | 10/1995 | Saito ............................ | 118/724 |
| 5,580,388 A | | 12/1996 | Moore .......................... | 118/728 |
| 5,584,936 A | | 12/1996 | Pickering et al. ............. | 118/728 |
| 5,683,518 A | | 11/1997 | Moore et al. .................. | 118/730 |
| 5,688,331 A | | 11/1997 | Aruga et al. .................. | 118/725 |
| 5,702,532 A | | 12/1997 | Wen et al. ...................... | 118/730 |
| 5,738,165 A | * | 4/1998 | Imai ............................. | 165/80.2 |
| 5,788,777 A | | 8/1998 | Burk, Jr. ....................... | 118/730 |
| 5,817,406 A | | 10/1998 | Cheung et al. ................ | 428/210 |
| 5,858,102 A | | 1/1999 | Tsai ............................... | 118/719 |
| 5,938,850 A | | 8/1999 | Arami et al. .................. | 118/715 |

(Continued)

FOREIGN PATENT DOCUMENTS

| | | |
|---|---|---|
| DE | 19934336 A1 | 3/2000 |
| DE | 10132448 A | 1/2003 |

(Continued)

OTHER PUBLICATIONS

Denbaars and Keller, Semiconductors and Semimetals, vol. 50, Academic Press, Inc., 1997, p. 11-35.

(Continued)

*Primary Examiner* — Ram N. Kackar
(74) *Attorney, Agent, or Firm* — Koppel, Patrick, Heybl & Philpott (57) ABSTRACT

The present invention discloses a susceptor mounting assembly for holding semiconductor wafers in an MOCVD reactor during growth of epitaxial layers on the wafers, that is particularly adapted for mounting a susceptor in an inverted type reactor chamber. It includes a tower having an upper and lower end with the upper end mounted to the top inside surface of the reactor chamber and a susceptor is arranged at the tower's lower end. Semiconductor wafers are held adjacent to the susceptor such that heat from the susceptor passes into wafers. A second embodiment of a susceptor mounting assembly according to the invention also comprises a tower having an upper and lower end. The tower's upper end is mounted to the top inside surface of the reactor chamber. A susceptor is housed within a cup and the cup is mounted to the tower's lower end.

30 Claims, 10 Drawing Sheets

U.S. PATENT DOCUMENTS

| | | | | |
|---|---|---|---|---|
| 6,001,183 | A | 12/1999 | Gurary et al. | 118/720 |
| 6,090,211 | A * | 7/2000 | Kamei et al. | 118/725 |
| 6,099,650 | A | 8/2000 | Carbonaro et al. | 118/715 |
| 6,118,100 | A | 9/2000 | Mailho et al. | 219/390 |
| 6,151,447 | A | 11/2000 | Moore et al. | 392/418 |
| 6,153,012 | A * | 11/2000 | Rupp et al. | 118/715 |
| 6,184,498 | B1 | 2/2001 | Kiyama | 219/390 |
| 6,217,662 | B1 | 4/2001 | Kong et al. | 118/725 |
| 6,257,881 | B1 | 7/2001 | Fiala et al. | 432/250 |
| 6,310,327 | B1 | 10/2001 | Moore et al. | 219/405 |
| 6,325,858 | B1 | 12/2001 | Wengert et al. | 118/725 |
| 6,423,192 | B1 | 7/2002 | Wada et al. | 204/192.12 |
| 6,534,748 | B1 * | 3/2003 | Zinman et al. | 219/390 |
| 8,133,322 | B2 | 3/2012 | Nakamura et al. | |
| 2001/0004880 | A1 | 6/2001 | Cho et al. | |
| 2001/0009141 | A1 | 7/2001 | Kong et al. | |
| 2001/0027970 | A1 | 10/2001 | Li et al. | |
| 2001/0052324 | A1 | 12/2001 | Rupp et al. | |
| 2002/0083899 | A1 | 7/2002 | Komeno et al. | |
| 2002/0127508 | A1 | 9/2002 | Jin et al. | |
| 2004/0175939 | A1 | 9/2004 | Nakamura et al. | |

FOREIGN PATENT DOCUMENTS

| | | |
|---|---|---|
| EP | 0106637 A1 | 4/1984 |
| EP | 414038 A1 | 8/1990 |
| EP | 0447031 A | 9/1991 |
| EP | 0519608 A | 12/1992 |
| EP | 519608 A1 * | 12/1992 |
| FR | 1462335 A | 12/1966 |
| JP | 56-073694 | 6/1981 |
| JP | 62-023108 | 1/1987 |
| JP | 63-018618 | 1/1988 |
| JP | 01-300516 | 12/1989 |
| JP | 04-186823 | 7/1992 |
| JP | 05-047666 | 2/1993 |
| JP | 06-120145 | 4/1994 |
| JP | 07-153696 | 6/1995 |
| JP | 08067596 A * | 3/1996 |
| JP | 08-139028 | 5/1996 |
| JP | 09-063967 | 3/1997 |
| JP | 09-321034 | 12/1997 |
| JP | 10-068079 | 3/1998 |
| JP | 04-128379 | 4/1998 |
| JP | 10-144773 | 5/1998 |
| JP | 2000031064 A * | 1/2000 |
| JP | 2000-091246 | 3/2000 |
| JP | 2002-124479 | 4/2002 |
| WO | WO 0218672 A | 3/2002 |
| WO | WO 03029516 A | 4/2003 |
| WO | WO 03098667 A | 11/2003 |

OTHER PUBLICATIONS

Aria et al., "Highly Uniform Growth on a Low-Pressure MOPVE Multiple Wafer System", Journal of Crystal Growth 170, pp. 88-91 (1997).

Holstein, "Modeling of Chimney CVD Reactors", Journal of Crystal Growth 125, pp. 311-319 (1992).

Lee et al., "MOCVD in Inverted Stagnation Point Flow", Journal of Crystal Growth, pp. 120-127 (1986).

Semiconductors and Semimetals, DenBaars and Keller, vol. 50, Academic Press, Inc., 1997, p. 11-35.

Parsons, J.D. "Inverted-Vertical OMVPE Reactor: Design and Characterization", Journal of Crystal Growth, North-Holland Publishing Co. Amsterdam, NL. vol. 116, No. 3/4, Feb. 1, 1992, pp. 387-396. XP000265338, ISSN: 0022-0248 p. 387-p. 389, figures 1-3.

Arai, T. et al. Highly Uniform Growth in a Low-Pressure MOVPE Multiple Wafer System: Journal of Crystal Growth, North-Holland Publishing Co. Amsterdam, NL., vol. 170, No. 1-4, 1997, p. 88-91, XP004007082, ISSN: 0022-0248 p. 88-89, figure 1.

Patent Abstracts of Japan, vol. 2000, No. 04, Aug. 31, 2000 and JP 2000 031064 A, Jan. 28, 2000.

Holstein, "Modeling of Chimney CVD Reactors", Journal of Crystal Growth 125, pp. 311-319, (1992).

Official Notice of Rejection and Comments, Dated: Aug. 1, 2008, Japanese Application 2003-532724.

Patent Abstracts of Japan, Publication No. 56-073694, Date: Jun. 18, 2981.

Patent Abstracts of Japan, Publication No. 09-063967, Date: Mar. 7, 1997.

Patent Abstracts of Japan, Publication No. 62-023108, Date: Jan. 31, 1987.

Patent Abstracts of Japan, Publication No. 01-300516, Date: Dec. 5, 1989.

Patent Abstracts of Japan, Publication No. 05-047666, Date: Feb. 26, 1993.

Official Notice of Rejection regarding related Japanese Patent Application No. 2004-506067, dated Apr. 28, 2009.

Patent Abstracts of Japan, Publication No. 10-144773, Date: May 29, 1998.

Patent Abstracts of Japan, Publication No. 06-120145, Date: Apr. 28, 1994.

Patent Abstracts of Japan, Publication No. 2002-124479, Date: Apr. 26, 2002.

Patent Abstracts of Japan, Publication No. 09-050965, Date: Feb. 18, 1997.

Patent Abstracts of Japan, Publication No. 07-058041, Date: Mar. 3, 1995.

Office Action of the IPO for related Taiwan Patent Application No. 091122351, dated: Nov. 20, 2008.

Related Office Action re Taiwan Application No. 091122351, dated Nov. 20, 2008.

Official Notice of Final Decision of Rejection, dated: Feb. 24, 2009 for related Japan Patent Application and Comments, Mar. 24, 2009, pp. 1-2.

Patent Abstracts of Japan, Publication No. 04-128379, Pub. date: Apr. 28, 1992.

Official Notice of Decision to Decline the Amendment and Final Decision of Rejection for related Japanese Application No. 2004-506067, dated: Jan. 20, 2010.

Decision on Rejection for related Chinese Patent Application No. 03816420.5, Dated: Jun. 5, 2009.

Related Official Notice of Rejection from Japanese Application No. 2004-506067, dated Aug. 21, 2009.

Patent Abstracts of Japan, Publication No. 07-176482, publication date: Jul. 24, 1995.

Patent Abstracts of Japan, Publication No. 63-018618, publication date: Jan. 26, 1988.

Patent Abstracts of Japan, Publication No. 06-104193, publication date: Apr. 5, 1994.

Office Action from related U.S. Appl. No. 11/483,387, dated: Nov. 10, 2009.

From related application: European Patent Application No. 02 776 040.4 Office Action dated Jan. 7, 2010.

Office Action from related U.S. Appl. No. 10/144,943, dated: Mar. 31, 2003.

Response to Office Action of related U.S. Appl. No. 10/144,943, dated: Jun. 30, 2003.

Office Action from related Application No. 10/144,943, dated: Nov. 24, 2003.

Response to Office Action of related Application No. 10/144,943, dated: Feb. 20, 2004.

Office Action from related U.S. Appl. No. 10/144,943, dated: May 20, 2004.

Response to Office Action of related U.S. Appl. No. 10/144,943, dated: Aug. 20, 2004.

Office Action from related U.S. Appl. No. 10/144,943, dated: Jul. 27, 2005.

Response to Office Action of related U.S. Appl. No. 10/144,943, dated: Oct. 27, 2005.

Office Action from related U.S. Appl. No. 10/144,943, Dated: Jan. 12, 2006.

Response to Office Action of related U.S. Appl. No. 10/144,943, dated: Jun. 12, 2006.

Notice of Allowance from related U.S. Appl. No. 10/144,943, dated: Jul. 3, 2006.

Office Action from related U.S. Appl. No. 11/483,387, dated: May 3, 2007.

Response to related office action U.S. Appl. No. 11/483,387, dated: Oct. 3, 2007.
Office Action from related U.S. Appl. No. 11/483,387, dated: Dec. 13, 2007.
Response to related office action U.S. Appl. No. 11/483,387, dated: Apr. 14, 2008.
Office Action from related U.S. Appl. No. 11/483,387, dated: Jun. 16, 2008.
Response to related office action U.S. Appl. No. 11/483,387, dated Sep. 16, 2008.
Office Action from related U.S. Appl. No. 11/483,387, dated: Nov. 21, 2008.
Response to related office action U.S. Appl. No. 11/483,387, dated: Feb. 23, 2009.
Office Action from related U.S. Appl. No. 11/483,387, dated: Apr. 14, 2009.
Response to related office action U.S. Appl. No. 11/483,387, dated: Aug. 14, 2009.
Office Action from related U.S. Appl. No. 11/483,387, dated Nov. 10, 2009.
Response to related office action U.S. Appl. No. 11/483,387, dated: Feb. 11, 2010.
Office Action from U.S. Appl. No. 11/483,387. Dated: Apr. 27. 2010.
Office Action from U.S. Appl. No. 10/256,814. Dated: Jun. 2. 2010.
Office Action from U.S. Appl. No. 10/256,814, dated: Sep. 20, 2010.
Response to Office Action from U.S. Appl. No. 10/256,814, filed Dec. 13, 2010.
Office Action from U.S. Appl. No. 11/483,387, dated: Jan. 4, 2011.
Office Action from U.S. Appl. No. 10/256,814, dated: Feb. 2, 2011.
Appeal Decision No. 2009-10287 from Japanese Patent Application No. 2003-532724 dated Aug. 16, 2011.
Office Action in counterpart European Patent Application No. 02776040 dated Sep. 1, 2010.
Office Action in counterpart European Patent Application No. 02776040 dated Feb. 14, 2011.
Interrogatory in Appeal 2009-10287 in counterpart Japanese Patent Application No. 2003-532724 issued Oct. 1, 2010.
Interrogatory in Japanese Appeal No. 2010-008611 from counterpart Japanese Patent Application No. 2004-506067 issued Mar. 29, 2011.
Preliminary Examination Report in Japanese Appeal No. 2010-008611 from counterpart Japanese Patent Application No. 2004-506067 dated Nov. 22, 2010.
Office Action from patent U.S. Appl. No. 10/256,814. dated: Aug. 10, 2011.
Response to Office Action from U.S. Appl. No. 10/256,814, filed Oct. 10, 2011.
Notice of Allowance from U.S. Appl. No. 10/256,814, dated: Nov. 2, 2011.
Office Action from U.S. Appl. No. 11/483,387, dated: Oct. 13, 2011.
Substantive Examination and Search Report for Malaysian Application No. PI 20023618. dated May 15. 2012.
Communication pursuant to Article 94(3) EPC, Application No. 02 776 040.4-2122, dated Sep. 26, 2011.
Notice of Rejection from Patent Application No. 2004-506067, dated Sep. 7, 2011.

* cited by examiner

SUSCEPTOR APPARATUS FOR INVERTED TYPE MOCVD REACTOR

BACKGROUND OF THE INVENTION

1. Field of the Invention

This invention relates to Metalorganic Chemical Vapor Deposition (MOCVD) reactors and more particularly to susceptors used in MOCVD reactors.

2. Description of the Related Art

Fabrication of gallium nitride (GaN) based semiconductor devices in MOCVD reactors is generally described in DenBaars and Keller, *Semiconductors and Semimetals*, Vol. 50, Academic Press Inc., 1997, p. 11-35. MOCVD is a nonequilibrium growth technique that relies on vapor transport of the precursers and subsequent reactions of group III alkyls and group V hydrides in a heated zone. Growth/source gasses and dopants are supplied to the reactor and are deposited as epitaxial layers on a substrate or wafer. One or more wafers usually rest on a structure of graphite called a susceptor that is heated by a heating element such as a radio frequency (RF) coil, resistance heated, or radiantly heated by a strip heater. The heated susceptor then heats the wafers, which allows for the source gasses to form epitaxial layers on the wafers.

Figure 1:
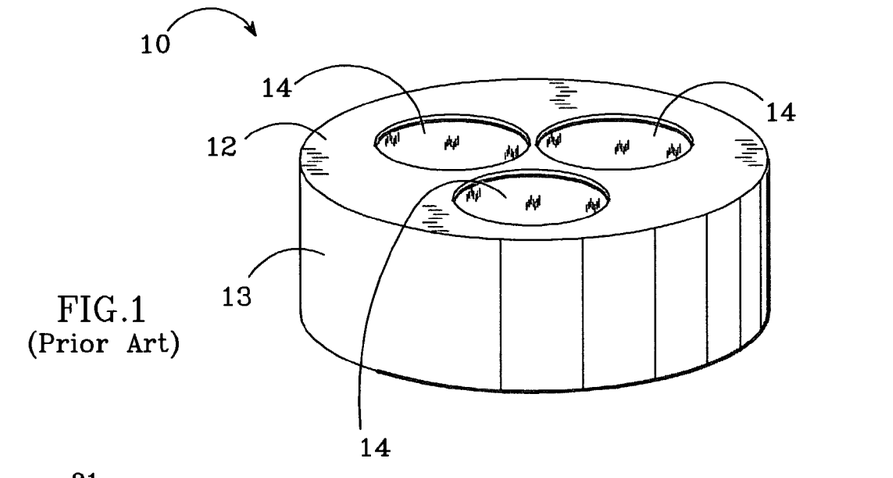
FIG. 1 is a perspective view of a prior art susceptor.

FIG. 1 shows a conventional susceptor 10 that is used in MOCVD reactors such as those provided by Thomas Swan Scientific Equipment Limited. It has a hollowed cylindrical shape and is mounted over the reactor's heating element at the bottom of the reactor, below a source gas inlet. It has a circular base plate 12 and cylindrical sleeve 13, with the circular plate 12 having a series of circular depressions 14 equally spaced around the susceptor's longitudinal axis. Each of the depressions 14 can hold a semiconductor wafer during growth. When the susceptor 10 is heated by the heating element the semiconductor wafers are also heated and when source gases enter the MOCVD reactor, they combine and deposit on the heated semiconductor wafer as epitaxial layers. The susceptor 10 can typically spin at speeds in the range of 1,000 to 2,000 rpm, which results in more uniform epitaxial layers on the wafers.

Conventional susceptors 10 are usually formed from a monolithic structure of graphite or coated graphite that absorbs heat from the heater element and conducts it to the wafers in contact with the susceptor 10. The entire susceptor 10 is heated uniformly to achieve consistent growth conditions across the entire surface of the wafers. However, during fabrication of the epitaxial layers, materials not only deposit on the heated wafer, but can also deposit on the heated susceptor 10. For example, during growth of Group III Nitride based devices, significant amounts of GaN, InGaN, AlInGaN, and similar compounds can deposit on the susceptor surfaces. The result is a buildup of reaction deposits on the susceptor that can adversely impact subsequent fabrication steps. The deposits can act as impurities during subsequent growth of the epitaxial layers and they can also result in poor interface transitions between subsequent layers of different compositions. For example, if a layer using an indium source gas is grown on the wafers, indium can be deposited on the susceptor 10. If the next layer to be grown does not include indium, indium from the susceptor surfaces can be included in the transition between layers and in the next layer. These impurities can cause poor device performance and can prevent consistent reproduction of semiconductor devices on the wafer. This deposition of materials on the susceptor surfaces also results in more reactants being consumed than is necessary for the formation of devices on the wafers.

Another disadvantage of conventional susceptors is that because the heating element heats the entire susceptor (not just the areas under or around the wafers) large amounts of heat are required. Conventional susceptors have a relatively large surface area in comparison to the wafers and most of the energy is wasted by not heating the wafers. This taxes the heater, contributing to early heater failures.

Another disadvantage of conventional susceptors is that they are difficult to manufacture. They are machined from a large section of graphite and if any part of the susceptor is damaged the entire structure can be unusable. The fabrication of the depressions can be extremely difficult because they are offset from the structure's longitudinal axis and as a result, they cannot be machined using a simple lathe, but must involve more complex processes. In some susceptors it may also be desirable to shape the surface of the depressions to compensate for variations in temperature. For the same reasons that it is difficult to machine the depressions, it also difficult to shape the surface of the depressions.

Various "inverted" type systems have been developed to grow semiconductor devices, wherein the susceptor is not mounted at the bottom of the reactor. An inverted type metal organic vapor phase epitaxy (MOVPE) system for the growth of Group III-V compound semiconductor materials is described in Aria et al., *Highly Uniform Growth on a Low-Pressure MOPVE Multiple Wafer System*, Journal of Crystal Growth 170, Pgs. 88-91 (1997). The wafers are held in a susceptor and placed facedown (inverted) in the growth chamber, with the flow gasses flowing under the growth surfaces. Gasses are injected into the chamber from one of the sidewalls of the chamber, through a triple flow channel, and the gas exhaust is on the opposite sidewall.

The fluid flow and mass transport for "chimney" chemical vapor deposition (CVD) reactors is discussed in Holstein, *Modeling of Chimney CVD Reactors*, Journal of Crystal Growth 125, Pgs. 311-319 (1992). A chimney reactor has wafers held on heated susceptors (usually two) that are vertically mounted on the interior side walls of the reactor.

Growth of GaAs based semiconductor devices in an MOCVD reactor is also discussed in Lee et al. *MOCVD in Inverted Stagnation Point Flow*, Journal of Crystal Growth, Pgs 120-127 (1886). The reactor is based on inverted stagnation point flow geometry where the reactants flow up towards wafers clamped to an inverted heated susceptor.

Each of these inverted type systems use conventional susceptors that are usually formed from a monolithic structure of graphite or coated graphite. They also suffer from the disadvantages described above.

SUMMARY OF THE INVENTION

The present invention seeks to provide an improved apparatus/assembly for mounting a susceptor in an inverted-type reactor for growing semiconductor material on the wafers. One embodiment of an apparatus according to the present invention comprises a tower having an upper and lower end. The tower's upper end is capable of being mounted to the top inside surface of a reactor chamber. A susceptor is arranged at the tower's lower end. The semiconductor wafers are held adjacent to the susceptor with heat from the susceptor passing to the wafers.

The present invention also discloses a reactor for growing epitaxial layers on semiconductor wafers. One embodiment of a reactor according to the present invention comprises a reactor chamber with a heating element. A susceptor is arranged to transfer heat from the heating element to the semiconductor wafers. A means is included for mounting the susceptor to the top inside surface of the reactor chamber such that heat from the heating element passes into the susceptor. A source gas inlet is included for gasses to grow epitaxial layers on the semiconductor wafers.

One embodiment of a susceptor used in the apparatus and reactors according to the present invention comprises a base structure made of a material having low thermal conductivity at high temperature to resist transferring heat from the heating element. The base structure has one or more plate holes, each having a respective heat transfer plug arranged within it and a wafer held adjacent to each of the plugs. The plugs are made of a material with high thermal conductivity at high temperatures to transfer heat from the reactor's heating element to the wafers.

These and other features and advantages of the invention will be apparent to those skilled in the art from the following detailed description, taken together with the accompanying drawings, in which:

BRIEF DESCRIPTION OF THE DRAWINGS

FIG. 2a shows a sectional view of one embodiment of a susceptor mounting assembly according to the present invention;

FIGS. 2b, 2c and 2d show magnified views of features of the susceptor mounting assembly of FIG. 2a;

FIG. 3 is a plan view of a base structure for the susceptor mounting assembly of FIG. 2a;

FIG. 5 is a plan view of a faceplate for the susceptor mounting assembly of FIG. 2a;

FIG. 7 is a plan view of a heat transfer plug for the susceptor mounting assembly of FIG. 2a;

FIG. 9 is a sectional view of another embodiment of a susceptor according to the invention that can be used in the susceptor mounting assembly of FIG. 2a;

DETAILED DESCRIPTION OF THE INVENTION

FIGS. 2a through 2d show one embodiment of a susceptor mounting assembly 40 in accordance with the present invention, that is particularly adapted for use in an inverted type MOCVD reactor wherein the susceptor mounting assembly is mounted to the top of the MOCVD reactor with its wafers facing down. The source gasses enter the reactor from below the susceptor mounting assembly to deposit semiconductor materials on the wafers.

Figures 2A, 2B, 2C, 2D:
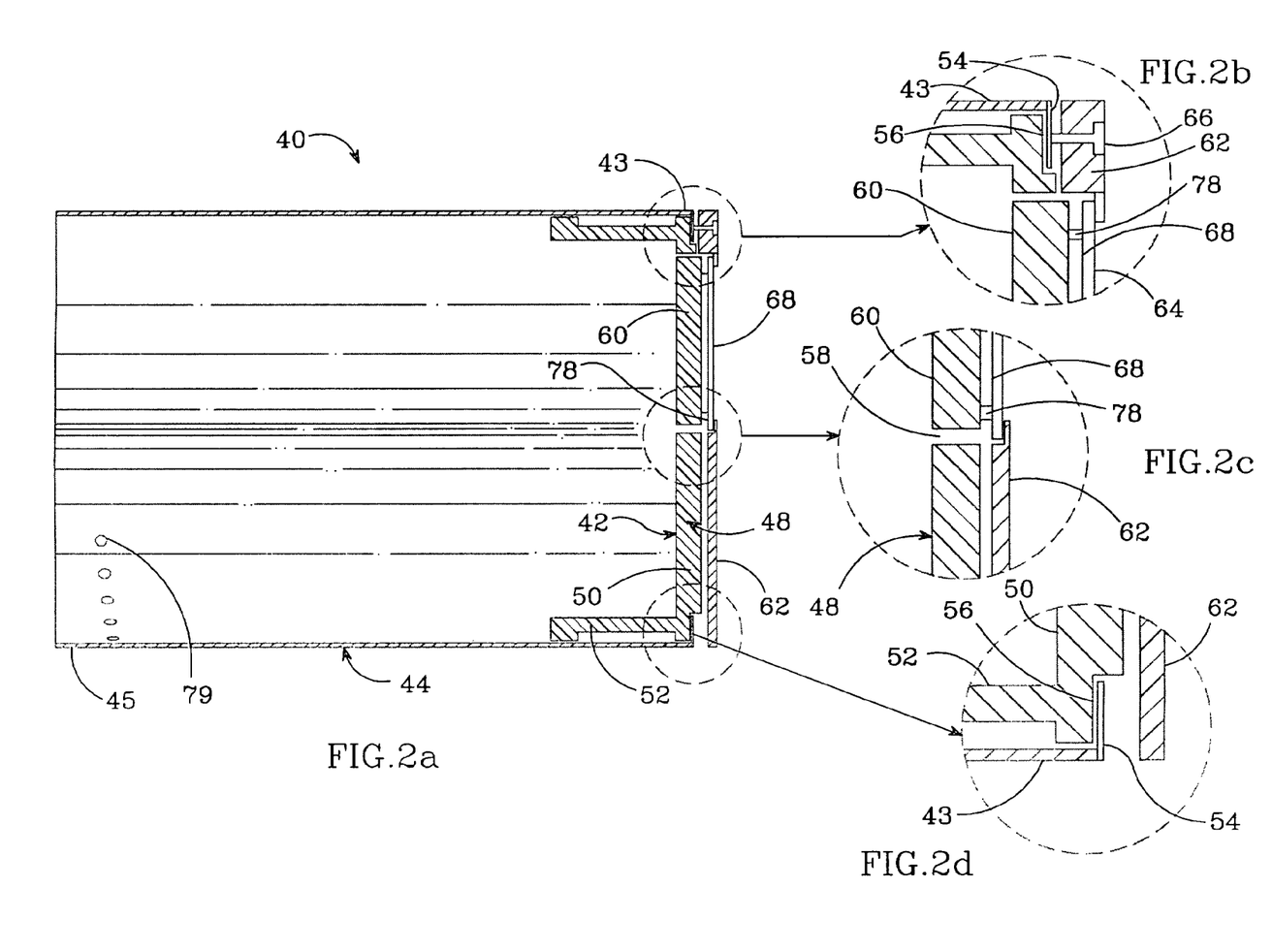

The mounting assembly 40 comprises a cylindrical tower, with a susceptor 42 mounted at its lower end 43. The tower's upper end 45 is mounted to the top of the MOCVD reactor, over a heater element (not shown). The cylindrical tower 44 can be made of many different materials but is preferably made of a metal.

Figure 3:
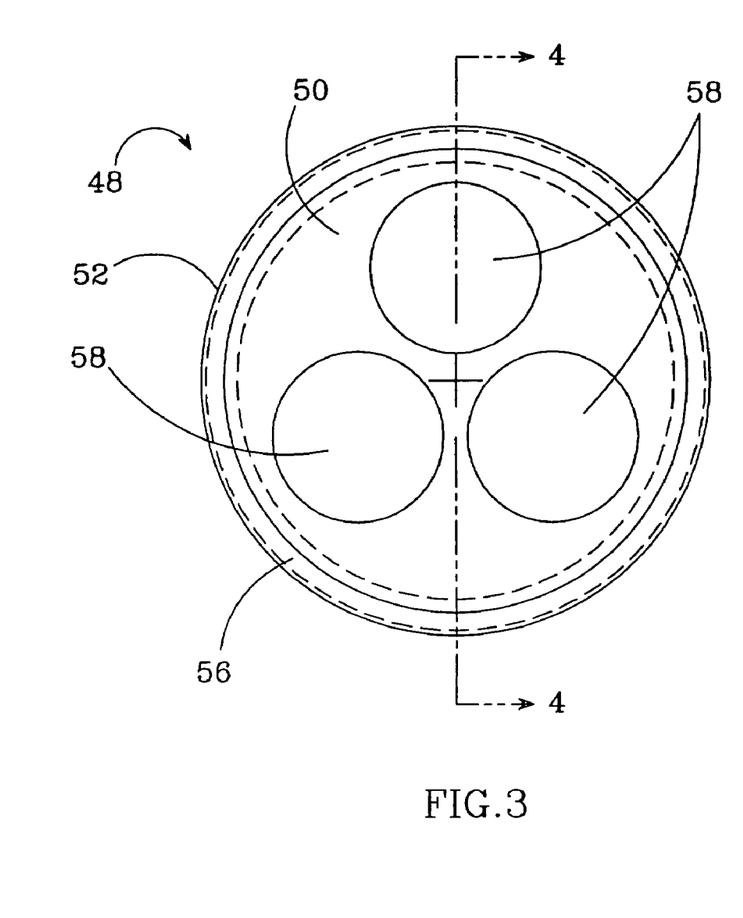
Figure 4:
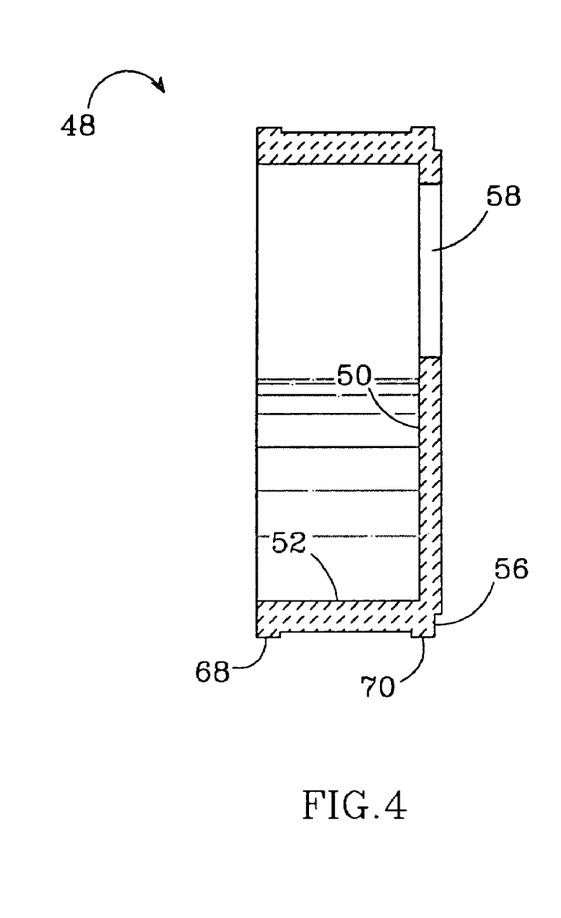
FIG. 4 is a sectional view of the base structure in FIG. 3, taken along section lines 4-4.

The susceptor 42 is mounted at the tower's lower end 43 and comprises a base structure 48, faceplate 62, and heat transfer plugs 60. Semiconductor wafers 68 are also shown mounted in the susceptor 42. One embodiment of a base structure is shown in FIGS. 3 and 4 and includes a base plate 50 and cylindrical sleeve 52 that can be separate but are preferably combined as one structure. The base plate 50 has circular plate holes 58 equally spaced around the structure's longitudinal axis. The base structure 48 has three holes 58, but different embodiments can have different numbers of holes depending on the number of wafers to be held, the diameter of the wafers and the diameter of the faceplate 50.

The base structure 48 should be made of a rigid material that has a low thermal conductivity at high temperature so that it transmits minimal heat from the (MOCVD) reactor's heating element. It should also be made of a material that is reflective so that it reflects the heating element's radiative heat to further reduce the amount of heat it transmits. It should also have a low thermal expansion, so that its expansion matches that of the other susceptor components and mounting assembly.

The base structure 48 can be made of many different materials such as boron nitride, fused quartz, aluminum nitride, or a ceramic. The aluminum nitride and ceramics embodiment can be coated with a material to reduce reactance with the source gasses. A preferred base structure 48 is made of boron nitride or fused quartz covered by boron nitride and can be manufactured using known methods. These materials have high thermal conductivity at low temperature, low thermal conductivity at high temperature, and boron nitride is white, which enhances the structure's reflectivity.

The outer surface of the sleeve 52 has upper and lower axial ridges 68, 70 (best shown in FIG. 4) that contact the inner surface of the tower 44. This provides for a space between the majority of the sleeve's outer surface and the tower 44, which helps reduce the heat transfer between the tower 44 and sleeve 52.

The base structure 48 can have different diameters depending on the diameter of the tower 44, with a suitable diameter being approximately 6.2 inches for holding three 2 inch wafers. The circular plate 50 and sleeve 52 can be different thicknesses, with a suitable thickness being approximately 0.2 inches.

Referring again to FIG. 2a, the base structure 48 is arranged within the mounting assembly 40, with its base plate 50 at the lower end 43 of the tower 44. The lower end 43 has an axial lip 54 (best shown in FIGS. 2b and 2d) that holds the base structure 48 within the tower 40. The outside surface of the base plate 50 has a depression 56 around its circumference that mates with the axial lip 54 to help secure the base structure 48 as the susceptor mounting assembly 40 rotates during the growth process.

Figure 5:
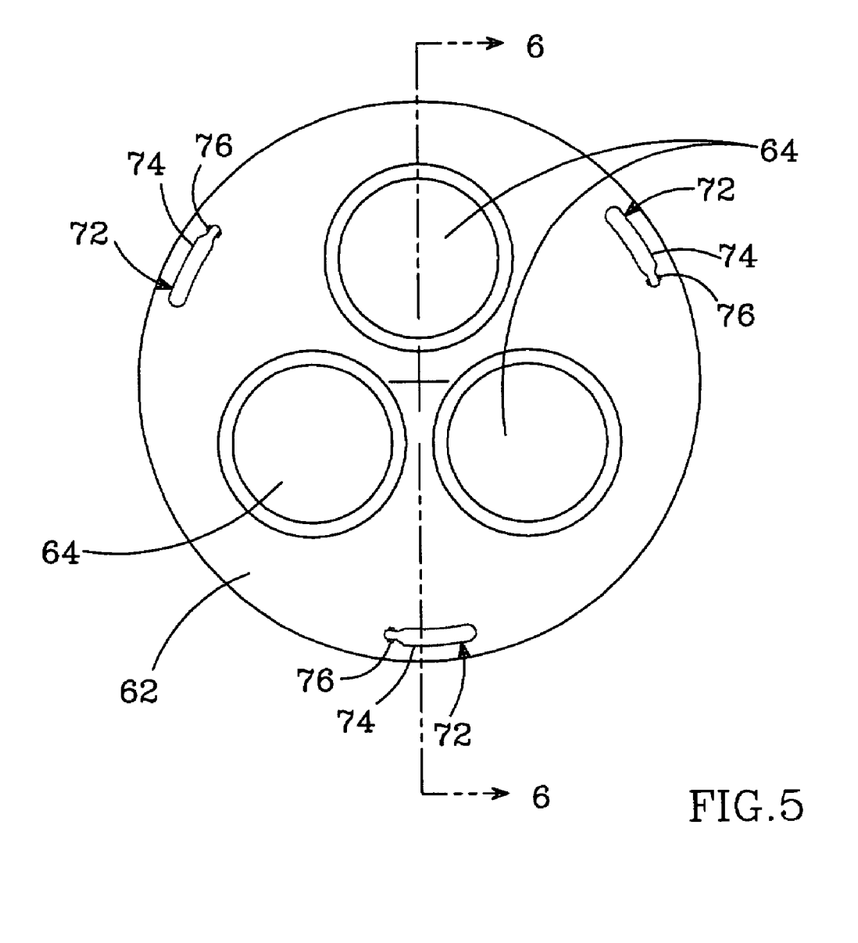
Figure 6:
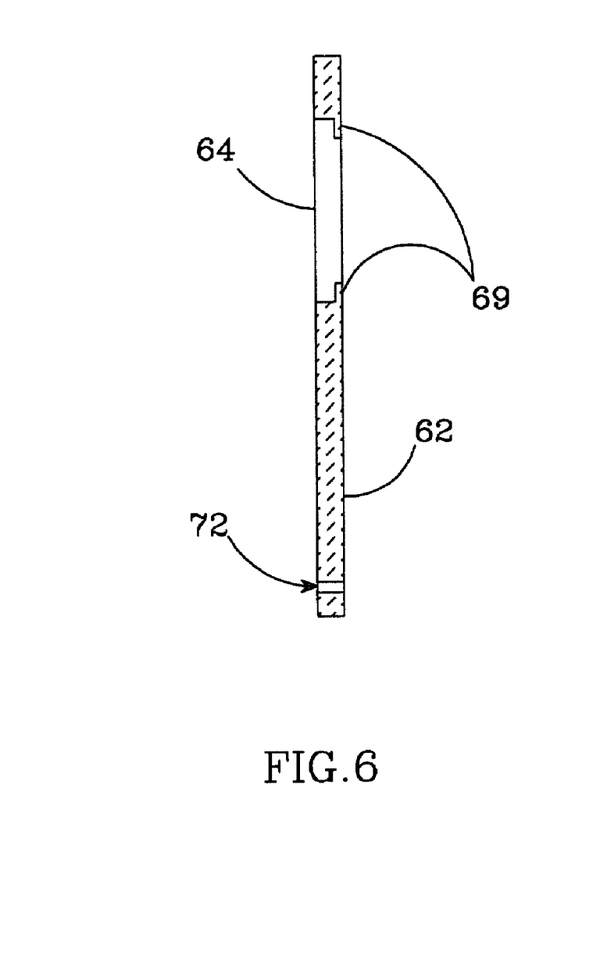
FIG. 6 is a sectional view of the faceplate in FIG. 5, taken along section lines 6-6.

The faceplate 62 is mounted at the lower end 43 of the tower 44 and FIGS. 5 and 6 show one embodiment of a faceplate according to the invention. The faceplate 62 has through holes 64 arranged to align with the base structure's plate holes 58. Each faceplate hole 64 is sized to house a semiconductor wafer 68 and each hole has an axial lip 69. A wafer 68 rests on the axial lip and heat transfer plug 60 rests on the wafer 68 (as best shown in FIGS. 2b and 2c).

Referring again to FIG. 2a, the faceplate 62 is mounted at the tower's lower end 43, adjacent to the base structure's circular plate 50. Many different mounting devices can be used such as clamps, hooks, or screws, with a preferred mounting device being locating pins 66 at the tower's lower end. The faceplate 62 has three slots 72 equally spaced near its outer edge that are each arranged to mate with a respective locating pin 66 when mounting the faceplate 62 to the tower's lower end 43. The head of each locating pin 66 passes through the wider section 74 of its respective axial slot 72 and the faceplate is turned until each slot's narrower section 76 mates with the stem of its locating pin 66. Each slot's narrow section 76 also has a counter bore so that when the faceplate 62 is lowered, the head of each locating pin 66 is housed within its respective counter bore. The counter bore allows the faceplate 62 to be mounted so that it is not in contact with the tower assembly 44 or the circular plate 50 (to prevent conductive heat transfer) and also secures the faceplate 62 as the tower assembly 44 rotates.

Small amounts of reactants can deposit on the base structure 48 during epitaxial growth. The faceplate 62 provides a surface with a greater resistance to deposition of reaction species, with the surface also being easy to clean. It is preferably infrared transparent so that is does not absorb optical heat. It should also be made of a material that does not react with MOCVD source gasses, such as quartz, pure silicon carbide, sapphire, silicon, coated graphite, graphite or tungsten, with a preferred material being quartz. Deposits can be cleaned from quartz by etching. The faceplate 62 should have substantially the same diameter as the tower 44 and can be different thicknesses, with a suitable thickness being 0.16 inches.

Figure 7:
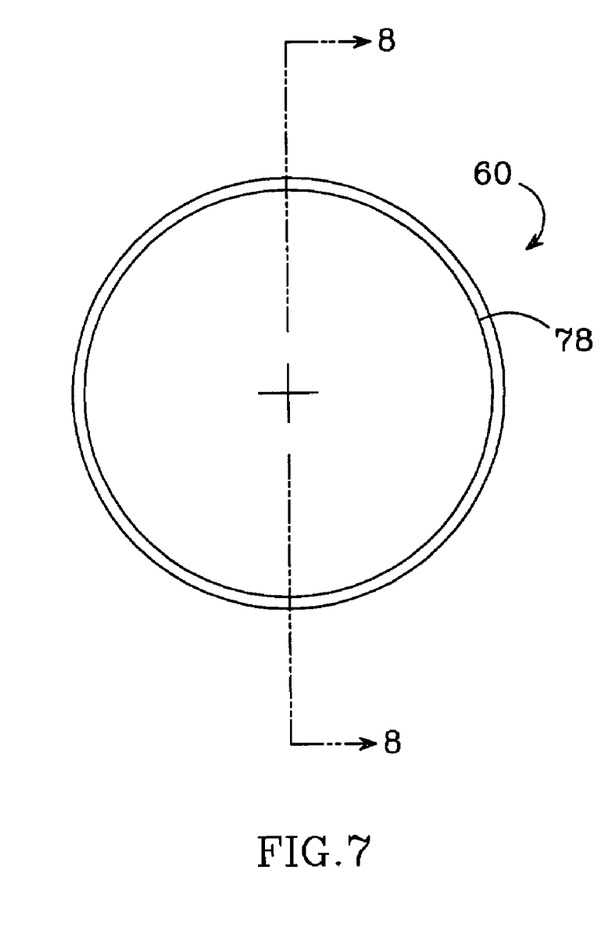
Figure 8:
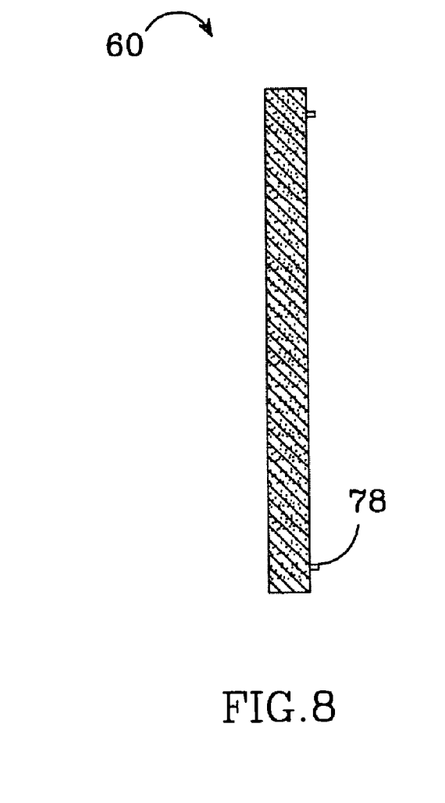
FIG. 8 is a sectional view of the plug in FIG. 7, taken along section lines 8-8.

Referring again to FIG. 2a, the susceptor 42 also includes heat transfer plugs 60, each of which fit within a respective plate hole 58. FIGS. 7 and 8 show one embodiment of a heat transfer plug 60 according to the present invention. Each plug 60 is substantially puck shaped and is designed to transfer heat from the heating element to a semiconductor wafer 68 held in one of the aligned plate holes 58 and faceplate holes 64. Each plug 60 rests on a semiconductor wafer and during growth of the epitaxial layers heat from the heating element is conducted through each plug 60, to its wafer 68. The plugs 60 are preferably made of a material having high thermal conductivity at high temperature and a dark color, both of which promote heat conduction. The preferred material for the plugs 60 is graphite or silicon carbide coated graphite.

Each plug 60 can have a rib 78 that forms a circle on the plug's surface adjacent to the wafer 68, with only the rib 78 contacting the wafer 68 (as best shown in FIGS. 2b and 2c). This provides a space between the wafer 68 and the plug 60 to promote even convective heating of the wafer 68. To further promote even heating of the wafer 68, the surface of the plug 60 that is adjacent to the wafer 68 can be convex, concave, or have other shapes. Each of the plugs is manufactured separately from the remainder of the susceptor so that the surfaces are easier to shape compared to shaping the surfaces in a conventional monolithic structure of graphite.

The plug 60 should have a diameter that allows it to fit closely within the circular plate and faceplate holes 58, 64 and can have many different thicknesses, with a suitable thickness being approximately 0.33 inches. The rib 78 can be many different sizes and shapes, with a suitable size being 0.002 inches high and 0.003 inches wide. It should also be understood that the ridge can form shapes other than a circle, such as a square, rectangle, triangle or hexagon.

When the susceptor assembly 40 is mounted from the top of an MOCVD reactor, over the reactor's heating element, the heating element is in close proximity to the susceptor 42, such that most of the heat interacts with the susceptor 42. The base structure 48 is made of a material that resists heat transfer and the plugs 60 are made of a material that promotes heat transfer. This arrangement results in most of the heat transferring to the plugs 60 and on to its adjacent wafer 68. The heat transfer into the base structure is minimized, which minimizes wasted heat and reduces the heating of the faceplate 62. This results in the minimization of reactants that are deposited on the faceplate 62 during growth of the epitaxial layers. By having the heating element within the susceptor 42, the amount of heat that passes into the tower 44 is also minimized.

The wafers 68 are mounted in the susceptor mounting assembly 40 before growth of the epitaxial layers, by placing the wafers 68 and transfer plugs 60 in the faceplate holes 64. The faceplate 62 is then positioned at the tower's lower end 43 with its holes 64 aligned with the base structure's holes 58. The locating pins 66 are then mated to the axial slots 72, to mount the faceplate 62 to the tower 44. The wafers 68 are uncovered by the faceplate 62 and when the plugs 60 are heated by the heating element, the wafers 68 are also heated. The susceptor assembly is typically rotated and source gasses are fed into the reactor to grow epitaxial layers on the wafers 68.

The tower 44 has a series of adjustment holes 79 near its upper end 45 that are used to attach the susceptor assembly 40 to the top of the reactor. By using different holes, the level at which the wafers are held can be adjusted. In one inverted MOCVD reactor, the growth gasses can enter the reactor through a "shower head" (not shown) that is mounted at the bottom of the reactor and is directed toward the wafers. By using different adjustment holes, the distance between the wafers 68 and the "shower head" can be adjusted, which can impact the growth characteristics of the epitaxial layers.

Figure 9:
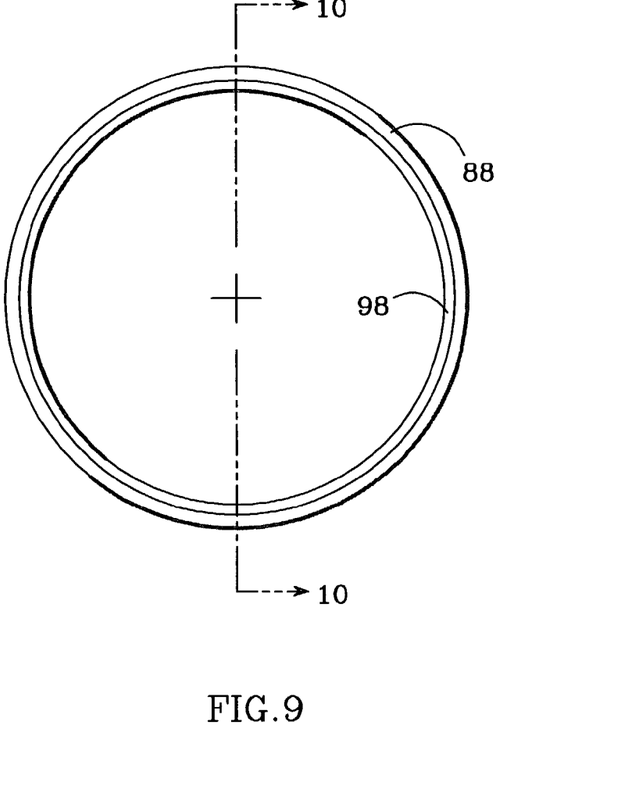
Figure 10:
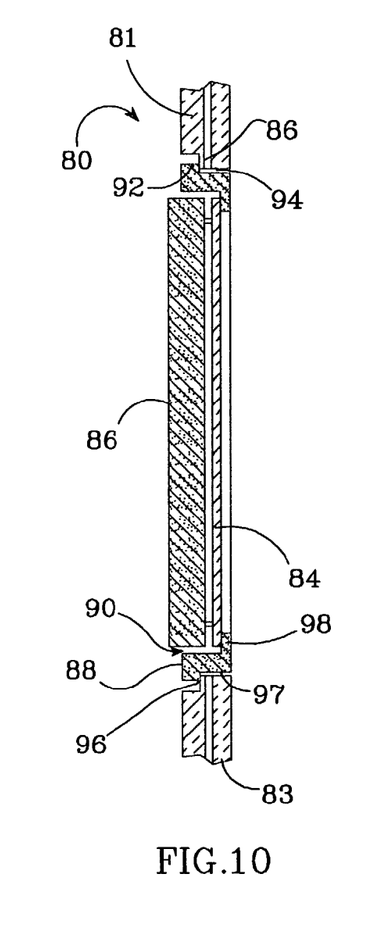
FIG. 10 is a sectional view of the wafer holder used in the susceptor of FIG. 9.

FIGS. 9 and 10 show another embodiment of a susceptor 80 in accordance with the present invention that is similar to the susceptor 42 above. It has a similar base structure circular plate 81 and faceplate 83 that have aligned holes and can be made of similar material to the corresponding parts in susceptor 42. A wafer 84 and plug 86 are arranged in the aligned plate and faceplate holes and function in much the same way as the wafer 68 and plug 60 in the susceptor 42. However, instead of each wafer and plug resting on a faceplate hole lip (as above), a wafer holder 88 is included that provides a lip for holding the wafer 84 and plug 86. In this embodiment each circular plate hole 90 has a lower ledge 92 on its inner surface, and each of the faceplate holes 94 do not have a lip. Each wafer holder 88 has an axial ridge 96 on its outer surface that rests on a ledge 92 to hold the wafer holder 88 in its respective hole 90. Each wafer holder 88 also has an internal lip 98 on which the wafer 84 rests and the plug 86 rests on the wafer 84, with both being arranged within the wafer holder 88.

The lower portion 97 of each wafer holder 88 protrudes from the circular plate 81, and when the faceplate 83 is mounted on the tower 44 (as described above), the lower portion 97 is within the faceplate hole 94. Each wafer holder 88 can be made of many different materials, with a suitable material being graphite or silicon carbide coated graphite.

As described above, the faceplate 83 is preferably made of quartz, which can be difficult and costly to machine. For example, when machining fine features such as a hole lip, the quartz can be damaged beyond repair and the faceplate rendered unusable. Also, it is difficult to machine small features in quartz and the lip thickness is limited to approximately 0.025 inches (graphite has a limit of 0.010 inches). One advantage of the susceptor 80 is that each of the faceplate holes 94 does not need to be machined to have a lip. This avoids the costs associated with the fine machining and avoids the waste of damaged faceplates. However, when using the susceptor 80 during growth, the lower surface of the wafer holder 88 can be exposed to the epitaxial growth process. This can result in graphite impurities being introduced into the growth process and can result in reactants being deposited on the graphite surface. These deposits can act as impurities that lead to pre-reaction in the growth of subsequent layers.

Figure 11:
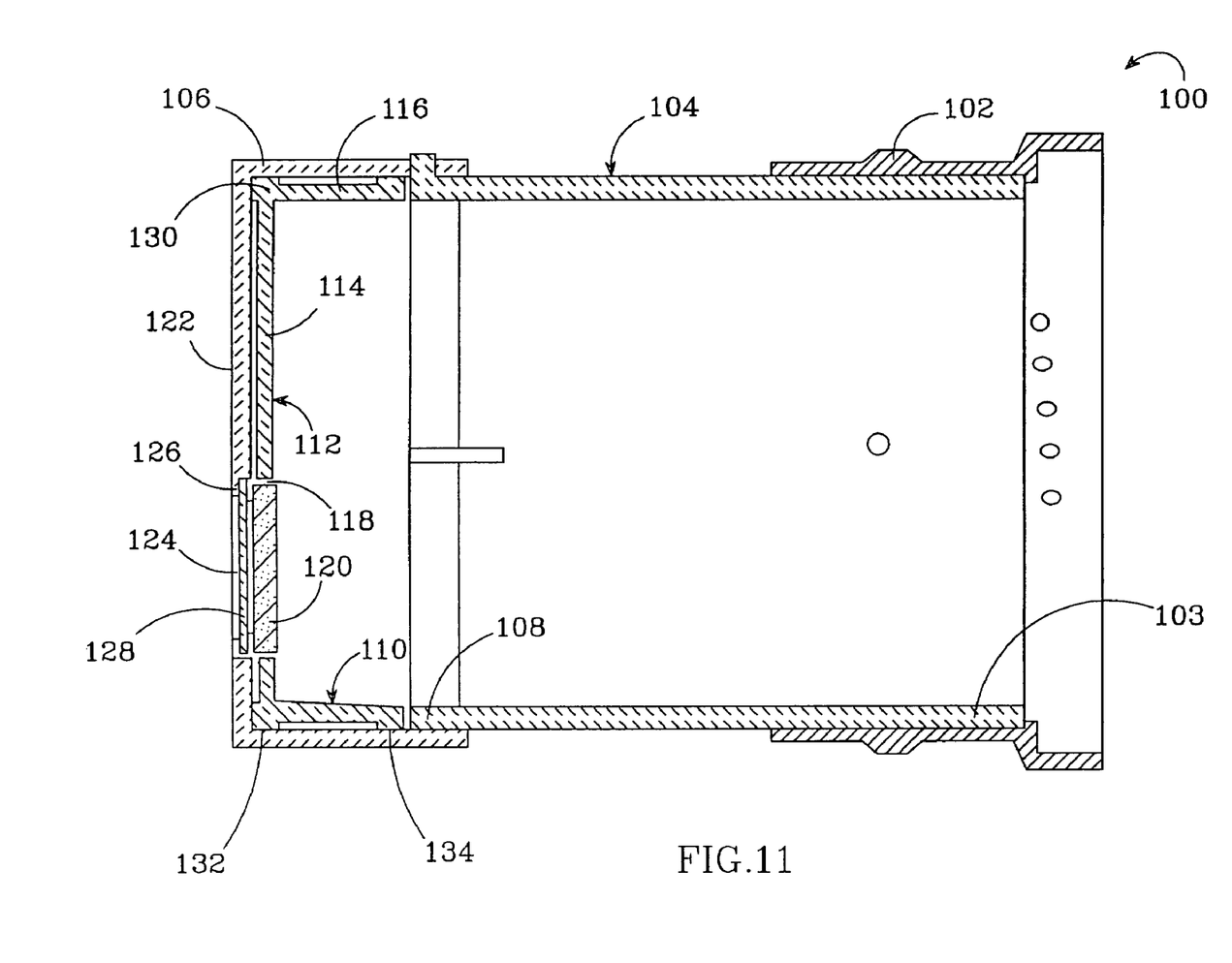
FIG. 11 is a sectional view of another embodiment of a susceptor mounting assembly according to the present invention.

FIG. 11 shows another embodiment of a susceptor mounting assembly 100 according to the present invention adapted for use in an inverted type MOCVD reactor, with the majority of the assembly 100 being made of quartz. The assembly 100 includes a metal tower retainer 102, which serves as a mounting point between the top of the MOCVD reactor and the remainder of the assembly 100. The tower retainer 102 is mounted to the upper end 103 of a cylindrical quartz tower 104, and a quartz cup 106 is mounted to the tower's lower end 108. A susceptor 110, according to the present invention, is housed within the quartz cup 106 at the tower's lower end 108.

Figure 12:
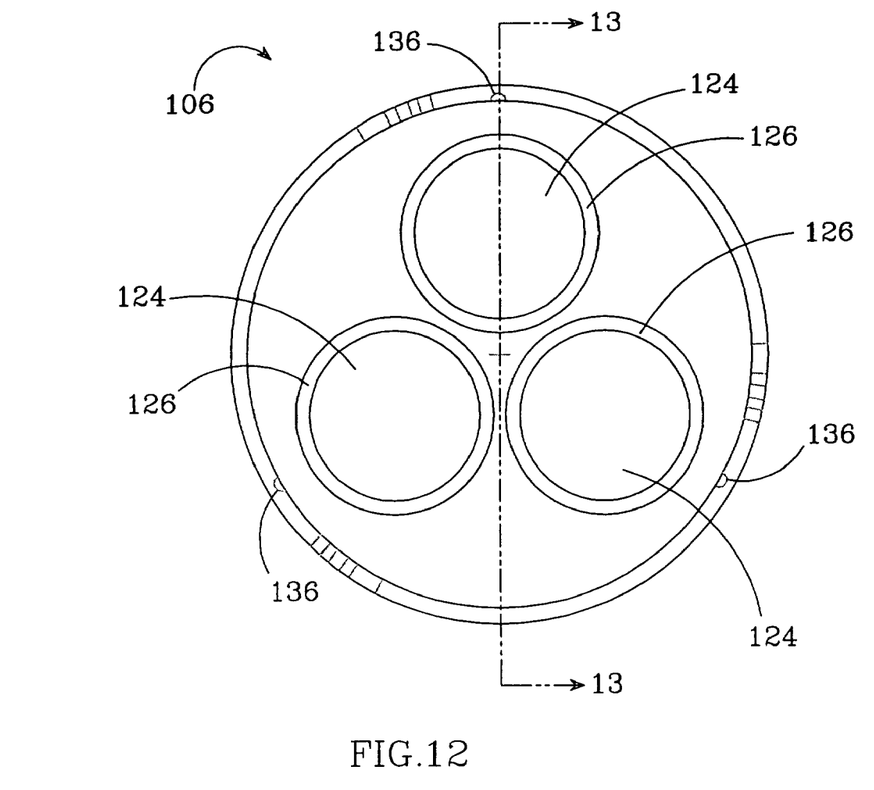
FIG. 12 is a plan view of a quartz cup used in the susceptor mounting assembly of FIG. 11.
Figure 13:
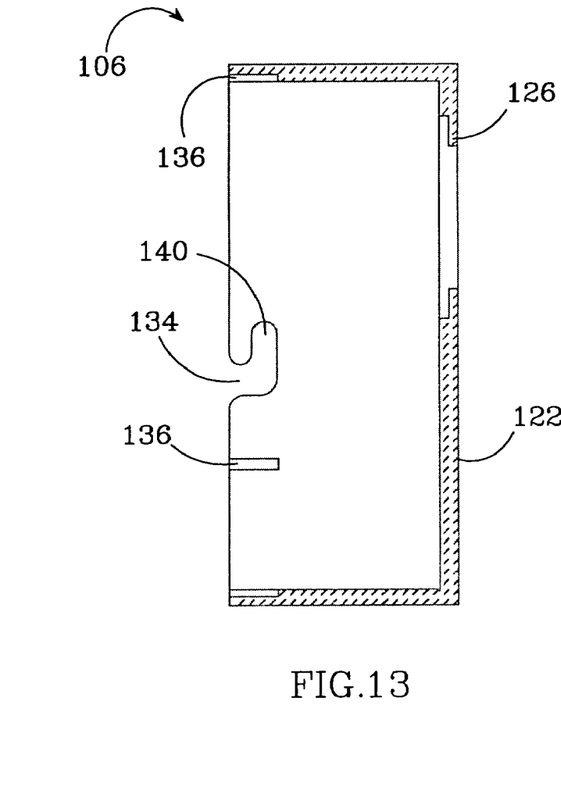
FIG. 13 is a sectional view of the quartz cup of FIG. 12, taken along section lines 13-13.

The susceptor 110 has a base structure 112 similar to the base structure 48 shown in FIGS. 3 and 4 above and includes a circular plate 114 and a sleeve 116. The structure 112 is similarly made of a material that resists heat transfer. The circular plate 114 has holes 118 for heat transfer plugs 120, with the holes equally spaced around the base structure's longitudinal axis. FIGS. 12 and 13 show the quartz cup 106, which has a base 122 with holes 124 that align with the plate holes 118, with each of the base holes 124 having a lip 126 to hold a wafer 128. A heat transfer plug 120, similar to the plug 60 shown above in FIGS. 7 and 8, then rests on the wafer 128. The plug 120 should similarly be made of a material that promotes heat transfer from the heating element.

Referring to FIG. 11, the base plate 114 is positioned adjacent to the cup base 122 and the plate 114 has a ridge 130 around the circumference of its surface adjacent the cup base 122. This ridge 130 allows for a space between the base plate 114 and cup base 122 to reduce conductive heat transfer. The sleeve 116 also has two axial ridges 132 and 134 that allow for a space between the sleeve 132 and the cup 106, which reduces conductive heat transfer between the two.

Referring again to FIGS. 12 and 13, the quartz cup 106 has three equally spaced J-slots 134 that provide a means for mounting the cup 106 to the tower 104, although other mounting methods could also be used. The cup 106 also includes three equally spaced pin grooves 136 for pins that secure the quartz cup 106 to the tower 104.

The quartz cup 106 and susceptor 110 can also be arranged to support the wafer holder embodiment (not shown) as described above in FIGS. 10 and 11. For the wafer holder embodiment, each of the holes in the circular plate has a ledge and the exterior ridge on each of the wafer holders is arranged to rest one of the ledges. The wafer holder has a lower lip that holds a wafer, and a heat transfer plug rests on the wafer.

For the embodiment shown in FIGS. 12 and 13, each wafer rest on a lip 126 on the inner surface of each hole in the cup base 122, and the heat transfer plug rests on the wafer. In this and the wafer holder embodiment, the wafers are substantially uncovered by the cup's base 122 so that growth gasses can deposit epitaxial layers on the wafers.

Figure 14:
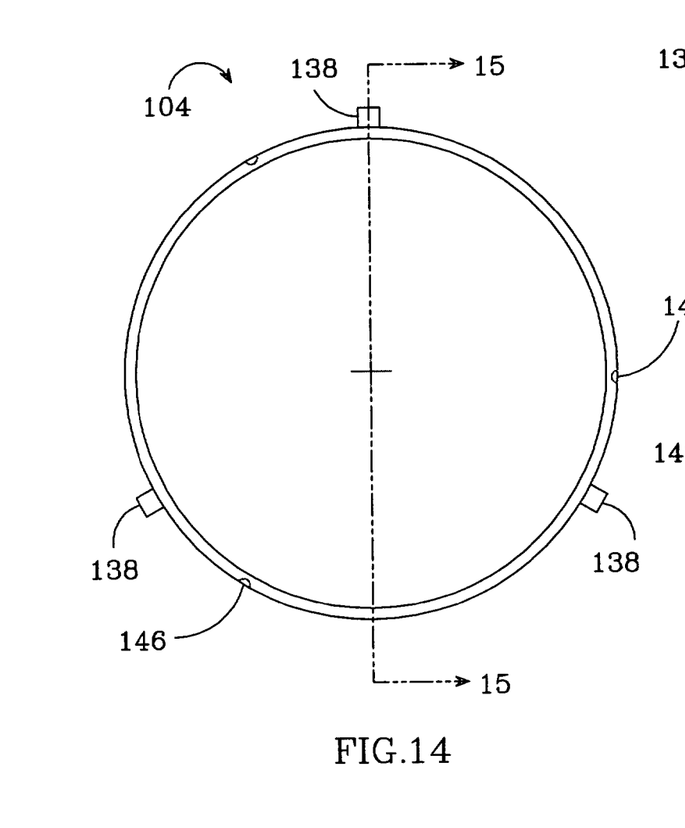
FIG. 14 is a plan view of a quartz tower used in the susceptor mounting assembly of FIG. 11.
Figure 15:
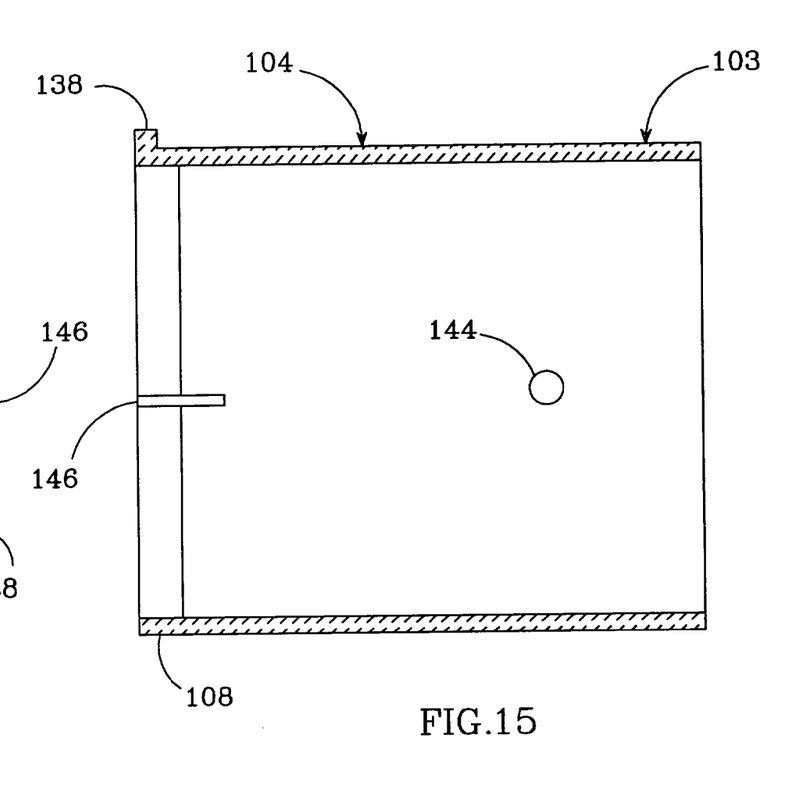
FIG. 15 is a sectional view of the quartz tower of FIG. 14, taken along section lines 15-15.

FIGS. 14 and 15 show one embodiment of a quartz tower 104 according to the invention, which has a slightly smaller diameter than the quartz cup 106. The tower 104 has three pins 138 on the outside surface of its lower end 108, for mating with the quartz cup's J-slots 134. The quartz cup 106 slides onto the end 108 of the quartz tower 104 and the pins 138 slide into the J-slots 134. The cup 106 is then turned until each of the pins 138 rests in the axial sections 140 of the J-slots 134. The tower 104 also has longitudinal grooves 146, which align with the pin grooves 136 in the quartz cup 106. The aligned grooves 136, 146 provide holes into which pins can be inserted to secure the quartz cup to the tower 104 to prevent the cup from turning off the tower pins 138 as the susceptor assembly 100 rotates. The tower shell 104 also has three equally spaced mounting holes 144 used to secure the tube retainer 102 to the tower 104.

Figure 16:
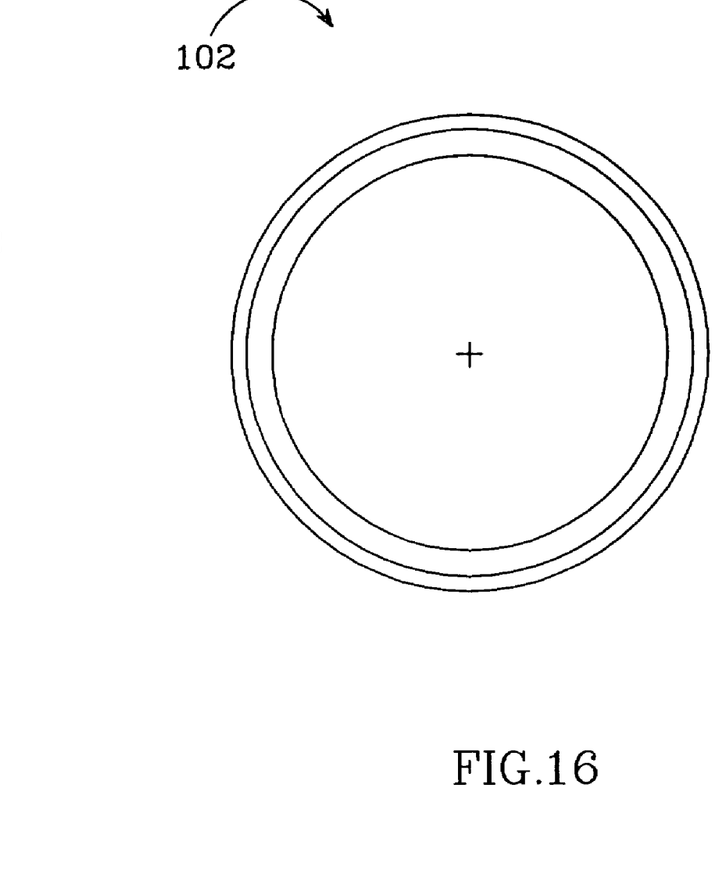
FIG. 16 is a plan view of a tower retainer used in the susceptor mounting assembly of FIG. 11.
Figure 17:
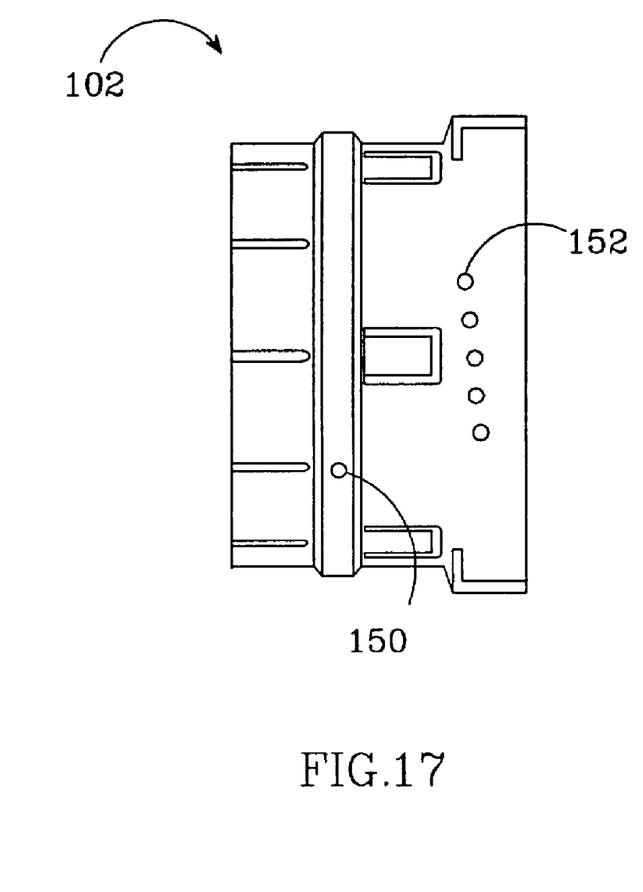
FIG. 17 is an elevation view of the tower retainer in FIG. 16.

FIGS. 16 and 17 show the quartz tower retainer 102, which mounts to the upper end 103 of the tower shell 104. The tower retainer 102 has mounting holes 150 that align with the tower holes 144. Pins or screws can be inserted into the aligned holes 144, 150 to mount the tube retainer 102 to the tower 104.

The tower retainer 102 has a series of adjustment holes 152 that are used to attach the susceptor assembly 100 to the top of the reactor. By using different holes, the distance between the wafers and the source gas inlet (shower head) can be adjusted, which can change the growth characteristics of the epitaxial layers.

To mount the wafers 128 into an MOCVD reactor using the assembly 100, the tower 104 and retainer 102 combination are mounted to the top inside surface of the reactor chamber, over the heating element. The wafers 128 are then placed into the quartz cup holes 124. The base structure 112 and plugs 120 are then arranged in the cup 106 and the cup 106 is mounted to the tower 104. The mounting of wafer 128 in the assembly 100 can be more reliable compared to mounting wafers in the faceplate 62 arrangement in the susceptor assembly 40 above. The faceplate 62 can be more difficult to handle and deposits on the faceplate 62 can interfere with the mating of the locating pins 66 within the slots 72. Also, the susceptor assembly 100 uses less power during growth because the quartz components 104, 106 absorb less of the heat compared to the metal tower 44. Quartz is also easier to clean compared to the metal tower 44, with one of the cleaning methods being etching. However, the assembly 100 is more expansive to manufacture and the quartz tower 104 may be limited to certain diameters when using standard tube sizes.

Figure 18:
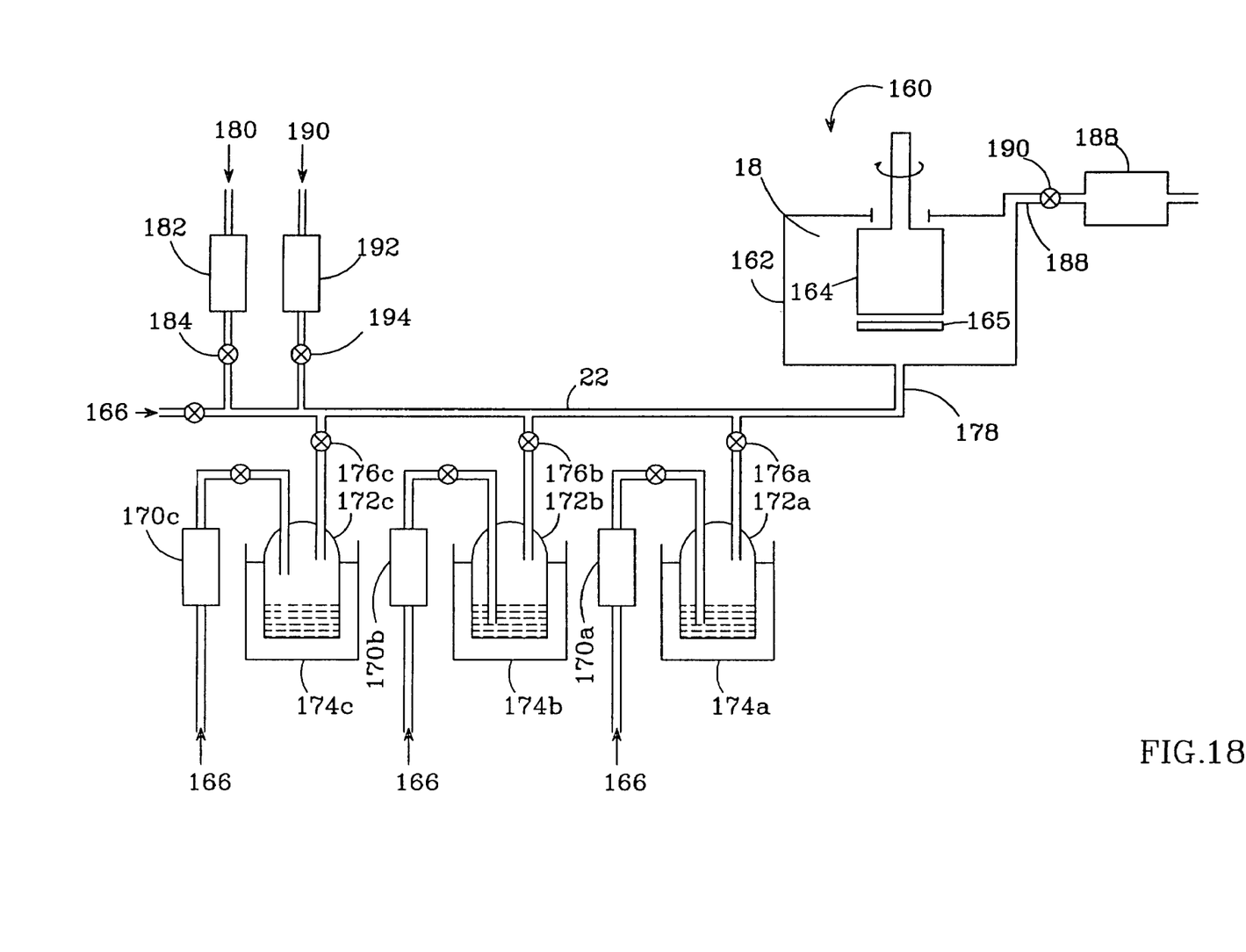
FIG. 18 is a simplified diagram of an MOCVD reactor using a susceptor mounting assembly according to the present invention.

FIG. 18 shows one embodiment of an MOCVD reactor 160 that can utilize a susceptor mounting assembly in accordance with the present invention. The reactor 160 comprises a reaction chamber 162 having a rotatable susceptor mounting assembly 164 mounted to the top inside surface. One or more wafers are mounted in the susceptor mounting assembly, in the faceplate 165. The wafers can be mounted differently for other susceptor mounting assembly embodiments. During growth, the susceptor mounting assembly 164 is heated by a heater element (not shown) that is arranged within the susceptor mounting assembly 164, adjacent to the wafers. The heating element can be a variety of heating devices but is usually a radio frequency (RF) coil, resistance coil, or a strip heater.

A carrier gas 166 is supplied to a gas line 168, the carrier gas being an inert gas such as hydrogen or nitrogen. The carrier gas 166 is also supplied through mass flow controllers 170a, 170b, 170c to respective bubblers 172a, 172b, 172c. Bubbler 172a can have a growth compound, such as an alkylated compound having a methyl group, e.g. trimethyl gallium (TMG), trimethyl aluminum (TMA) or timethyl indium (TMI). Bubbler 172b and 172c may also contain a similar methyl group compound to be able to grow an alloy of a Group III compound. The bubblers 172a, 172b, 172c are typically maintained at a predetermined temperature by constant temperature baths 174a, 174b, 174c to ensure a constant vapor pressure of the metal organic compound before it is carried to the reaction chamber 162 by the carrier gas 166.

The carrier gas 166 which passes through bubblers 172a, 172b, 172c is mixed with the carrier gas 166 flowing within the gas line 168 by opening the desired combination of valves 176a, 176b, 176c. The mixed gas is then introduced into the reaction chamber 162 through a gas inlet port 178 formed at the upper end of the reaction chamber 162. A shower head inlet (not shown) can be included at the inlet port 178.

A nitrogen containing gas 180 such as ammonia, is supplied to the gas line 168 through a mass flow controller 182 and the flow of nitrogen containing gas is controlled by valve 184. If the carrier gas 166 is mixed with the nitrogen containing gas 180 and the TMG vapor within the gas line 168 and then introduced into the reaction chamber 162, the elements are present to grow gallium nitride on the wafer through thermal decomposition of the molecules present in the TMG and ammonia containing gas.

To dope alloys of gallium nitride on the wafer, one of the bubblers 172a, 172b, 172c not being used for the TMG is used for a dopant material, which is usually Magnesium (Mg) or Silicon (Si), but can be other material such as beryllium, calcium, zinc, or carbon. Bubbler 172b or 172c can be used for an alloy material such as boron aluminum, indium, phosphorous, arsenic or other materials. Once the dopant and alloy are selected and one of the valves 176a, 176b, 176c is opened to allow the dopant to flow into gas line 168 with the gallium and nitrogen containing gas 180, the growth of the doped layer of gallium nitride takes place on the wafer.

The gas within the reaction chamber 162 can be purged through a gas purge line 186 connected to a pump 188 operable under hydraulic pressure. Further, a purge valve 190 allows gas pressure to build up or be bled off from the reaction chamber 162.

The growth process is typically stopped by shutting off the gallium and dopant sources by closing valves 176a and 176b, and keeping the nitrogen containing gas and the carrier gas flowing. Alternatively, the reaction chamber 162 can be purged with a gas 190 that can be controlled through a mass flow controller 192 and valve 194. The purge is aided by opening valve 190 to allow the pump 188 to evacuate the reaction chamber 162 of excess growth gasses. Typically, the purge gas 190 is hydrogen, but can be other gasses. The wafers are then cooled by turning off power to the heater element.

Although the present invention has been described in considerable detail with reference to certain preferred configurations thereof, other versions are possible. As described above, the new susceptor can be used in many different reactors beyond MOCVD reactors and can be used in many different types of MOCVD reactors. The new susceptors and susceptor assemblies can be made of many different materials with many different dimensions. Therefore, the spirit and scope of the appended claims should not be limited to the preferred versions in the specification.

We claim:

1. An apparatus for holding semiconductor wafers in an inverted-type semiconductor growth reactor chamber for growth of semiconductor materials on the wafers, comprising:

a tower comprising an upper end and a lower end opposite said upper end, said upper end comprising a plurality of mounting points enabling said tower to be mounted to the top inside surface of a reactor chamber at a plurality of selectable mounting positions, the height of said tower adjustable according to the selected mounting point and relative to a gas inlet of said reactor;

a cup mounted to the lower end of said tower and comprising a plurality of cup holes;

a susceptor arranged at said tower's lower end in said cup, wherein said selectable mounting points allow said susceptor to be movable with said tower relative to said gas inlet, said susceptor comprising a first portion made of a material having lower thermal conductivity at high temperature and low thermal expansion, said material also capable of reflecting radiative heat, and a second portion having high thermal conductivity at high temperature, the semiconductor wafers on a retaining lip of said cup aligned with said cup holes and held adjacent to said second portion with heat from said susceptor passing to the wafers primarily through said second portion, wherein said first portion comprises a spacer element arranged within said cup, said spacer element located between said first portion and said cup, said first portion contacting said cup along said spacer element, wherein said first portion comprises one or more plate holes, and wherein said second portion fits within one of said one or more plate holes.

2. The apparatus of claim 1:

wherein said first susceptor portion comprises a base structure made of a material having low thermal conductivity at high temperature to resist transferring heat, said base structure comprising said one or more plate holes; and wherein said second susceptor portion comprises one or more heat transfer plugs, each of which is arranged within a respective one of said one or more plate holes and aligned with a respective one of said cup holes, each of said wafers held adjacent to a respective one of said plugs, said plugs made of a material with high thermal conductivity at high temperatures to promote the transfer heat to said wafers.

3. The apparatus of claim 1, wherein said cup comprises a cup base, said cup holes in said cup base.

4. The apparatus of claim 3, wherein each of said one or more cup holes comprises said retaining lip to hold a respective one of said wafers, a respective one of said plugs resting on one of said wafers.

5. The apparatus of claim 1, wherein said tower and said cup are made of an infrared transparent material.

6. The apparatus of claim 1, wherein said tower and cup are made of a material that allows deposits to be removed by etching.

7. The apparatus of claim 1, wherein said tower and said cup are made of quartz.

8. The apparatus of claim 1, wherein said spacer element comprises one or more ridges, said spacer element contacting said cup along said ridges.

9. The apparatus of claim 1, wherein said cup comprises J-slots and said tower comprises pins, said cup mounted to said tower by mating said pins and J-slots.

10. The apparatus of claim 1, wherein said cup is made of quartz, which does not react with semiconductor growth gasses.

11. The apparatus of claim 1, wherein said cup is made of a material that is infrared transparent.

12. The apparatus of claim 1, wherein said tower further comprises a tower retainer at its upper end wherein said tower is mounted to the top inside surface of said reactor chamber through said tower retainer.

13. The apparatus of claim 1, wherein said second portion is made of a material that is black or grey in color.

14. The apparatus of claim 1, wherein said second portion comprises graphite.

15. The apparatus of claim 1, wherein said second portion comprises silicon carbide coated graphite.

16. The apparatus of claim 1, wherein the first portion comprises a surface that is adjacent to the cup, and wherein said spacer element is arranged around a circumference of the surface that is adjacent to the cup.

17. The apparatus of claim 1, wherein said spacer element provides a space between the first portion and the cup.

18. The apparatus of claim 1, wherein the first portion comprises a pair of axial ridges arranged within said cup.

19. The apparatus of claim 18, wherein the pair of axial ridges provides another space between the first portion and the cup.

20. The apparatus of claim 1, wherein each cup hole aligns with a respective one of said plate holes.

21. A reactor for growing epitaxial layers on semiconductor wafers, comprising:

a reactor chamber with a heating element;

a susceptor arranged to transfer heat from said heating element to the semiconductor wafers, said susceptor comprising a first portion made of a material with low thermal conductivity at high temperature, said material also being radiatively reflective, said first portion further comprising a spacer element, and a second portion made of a material with high thermal conductivity at high temperature, said second portion comprising a circular rib on its surface adjacent to its respective one of said wafers, said second portion contacting and resting on its wafer along said circular rib, said susceptor further comprising a cup, wherein said first portion contacts said cup along said spacer element arranged within said cup, said spacer element located between said first portion and said cup, wherein said first portion comprises one or more plate holes, and wherein said second portion fits within one of said one or more plate holes;

a means for mounting said susceptor to the top inside surface of said reactor chamber such that heat from said heating element passes into said susceptor, with the semiconductor wafers held adjacent to said second portion of said susceptor such that heat from said heating element passes to the wafer; and a source gas inlet into the reactor chamber to introduce gasses into the reactor to grow epitaxial layers on the semiconductor wafers, said mounting means comprising a plurality of adjustment points providing for a plurality of selectable distances between said source gas inlet and said susceptor.

22. The reactor of claim 21, wherein said susceptor comprises said one or more plate holes and said cup comprising a cup base with one or more cup base holes, each of which aligns with a respective one of said plate holes.

23. The apparatus of claim 22, wherein said cup is made of an infrared transparent material.

24. The apparatus of claim 22, further comprising a plurality of conductive plugs, wherein each of said one or more cup base holes comprises a retaining lip to hold a respective one of the wafers, a respective one of said plugs resting on one of the wafers.

25. The reactor of claim 21, wherein said mounting means comprises a tower comprising an upper and lower end, and said cup mounted to said lower end with said susceptor mounted within said cup, said upper end capable of being mounted to the top inside surface of a reactor chamber, the semiconductor wafers held adjacent to said second portion of said susceptor such that heat passes through said second portion to the wafers.

26. The reactor of claim 21, wherein said first portion comprises a surface that is adjacent to the cup, and wherein said spacer element is arranged around a circumference of the surface that is adjacent to the cup.

27. The reactor of claim 21, wherein said spacer element provides a space between the first portion and the cup.

28. The reactor of claim 21, wherein the first portion comprises a pair of axial ridges arranged within said cup.

29. The reactor of claim 28, wherein the pair of axial ridges provides another space between the first portion and the cup.

30. The reactor of claim 21, wherein said cup comprises a plurality of cup holes and wherein each cup hole aligns with a respective one of said plate holes.

* * * * *